(12) United States Patent
Song et al.

(10) Patent No.: US 6,432,616 B1
(45) Date of Patent: Aug. 13, 2002

(54) WATER SOLUBLE POLYMER AND PHOTORESIST COMPOSITION CONTAINING THE SAME

(75) Inventors: Tsing-Tang Song, Taipei; Shung-Jim Yang, Tao-Yuan; Hsiu-Mei Chen; Yi-Hua Liu, both of Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/634,472

(22) Filed: Aug. 7, 2000

(30) Foreign Application Priority Data

Dec. 17, 1999 (TW) ........................ 88122229 A

(51) Int. Cl.$^7$ .............................. G03C 1/73; C08F 8/30; C08F 8/34; C08F 8/40; C08F 2/46
(52) U.S. Cl. ................... 430/285.1; 430/281.1; 430/270.1; 430/905; 430/916; 525/329.5; 525/330.1; 525/383; 525/385; 522/85; 522/37; 522/40; 522/43; 522/46; 522/39; 522/53
(58) Field of Search ............................ 525/329.5, 330.1, 525/383, 385; 522/85, 37, 40, 43, 46, 39, 53; 430/287.1, 285.1, 910, 905, 916, 270.1, 281.1

(56) References Cited

U.S. PATENT DOCUMENTS

| 4,532,052 A | * | 7/1985 | Weaver et al. ........... 252/855 R |
| 4,565,857 A | * | 1/1986 | Grant ........................ 527/301 |
| 4,605,622 A | * | 8/1986 | Hasagawa et al. ........... 435/182 |
| 4,741,969 A | * | 5/1988 | Hayama et al. ............. 428/514 |
| 5,045,435 A | | 9/1991 | Adams et al. ............... 430/288 |
| 5,411,837 A | | 5/1995 | Bottomley et al. .......... 430/281 |
| 5,780,117 A | * | 7/1998 | Swartz et al. ................ 427/493 |

FOREIGN PATENT DOCUMENTS

JP 7-145263 * 6/1995

OTHER PUBLICATIONS

English Abstract for JP 7–145263 Provided by American Chemical Society, 1995.*

* cited by examiner

*Primary Examiner*—Janet Baxter
*Assistant Examiner*—Sin J. Lee
(74) *Attorney, Agent, or Firm*—Darby & Darby

(57) ABSTRACT

The present invention provides a water soluble polymer which is prepared by the following steps. First, a carboxyl group-containing polymer is reacted with an alkaline reagent so that a portion of the carboxyl groups are reacted in an amount sufficient to make the polymer water soluble. Then, the polymer obtained is reacted with an epoxide containing unsaturated bonds and/or heteroatoms so that 1 to 100 mole percent of the remaining carboxyl groups of the polymer are reacted with the epoxide to form ester groups via a ring-opening reaction of epoxides, wherein the heteroatom can be silicon, nitrogen, phosphorus or sulfur. The water soluble polymer of the present invention can be used as a photo-sensitive resin. When the photoresist composition is used for preparing printed ciruit boards, it exhibits high photosensitivity, good water dispersability, storage stability, and good adhesion to copper. In addition, the problem of sticking to the mask can be prevented.

15 Claims, No Drawings

WATER SOLUBLE POLYMER AND PHOTORESIST COMPOSITION CONTAINING THE SAME

BACKGROUND OF THE INVENTION

1. Field of the Invention

The present invention relates to a water soluble polymer, and more particularly to a photoresist composition containing the water soluble polymer.

2. Description of the Prior Art

In recent years, technology of integrated circuits has progressed quite a lot, and photoresists have long been used for the preparation of printed circuit boards and solder masks. The resins used in the photoresist are mainly organic solvent soluble resins, and the photoresist is developed with organic solvents to form circuits. The conventional phohotoresist used for printed circuit boards contains about 40–70 wt % of organic solvent. During the exposing and developing process, about 60–80% of the organic solvent will evaporate into the air, which is detrimental to human health and environment. For the environmental concern, aqueous alkaline solutions has been developed as the developing reagent.

To further lessen the volatile organic compounds (VOCs) problem, some water soluble photoresists have been developed, such as acrylate latexes and water soluble epoxy resins. The water soluble photoresist can not only be dissolved in water, but also has the advantage of easier handling.

In U.S. Pat. No. 5,411,837, the waterborne photoresist is prepared by emulsion polymerization. A surfactant should be added to maintain the dispersion stability of latex. However, the surfactant easily pollutes the developing tank and affects the adhesion of the photoresist with copper. In U.S. Pat. No. 5,045,435, an alkaline reagent (such as ammonia) is used to partially neutralize a carboxyl group-containing acrylic copolymer which is water insoluble so as to convert it into a water soluble latex. However, the water soluble latex has low photosensitivity.

SUMMARY OF THE INVENTION

The object of the present invention is to solve the above-mentioned problems and to provide a water soluble polymer having high photosensitivity, good water dispersability, and storage stability.

Another object of the present invention is to provide a photoresist composition. When the photoresist composition is coated on a printed circuit board, then dried and exposed to UV light afterwards, it is not tacky and will not stick to the mask. In addition, it has good adhesion to the copper on the printed circuit board.

To achieve the above-mentioned objects, the water soluble polymer of the present invention is prepared by the following steps of:

(a) reacting a carboxyl group-containing polymer with an alkaline reagent so that a portion of the carboxyl groups are reacted in an amount sufficient to make the polymer water soluble; and (b) reacting the polymer obtained from step (a) with an unsaturated bonds-containing epoxide and/or heteroatoms-containing epoxide so that 1 to 100 mole percent of the remaining carboxyl groups of the polymer are reacted with the epoxide to form ester groups via a ring-opening reaction of epoxides, wherein the heteroatom is selected from the group consisting of silicon, nitrogen, phosphorous, and sulfur.

The photoresist composition of the present invention includes the following components:

(1) 10 to 50 weight % of a photosensitive resin which is a water soluble polymer prepared by the following steps of:

(a) reacting a carboxyl group-containing polymer with an alkaline reagent so that a portion of the carboxyl groups are reacted in an amount sufficient to make the polymer water soluble; and (b) reacting the polymer obtained from step (a) with an unsaturated bonds-containing epoxide and/or heteroatoms-containing epoxide so that 1 to 100 mole percent of the remaining carboxyl groups of the polymer are reacted with the epoxide to form ester groups via a ring-opening reaction of epoxides, wherein the heteroatom is selected from the group consisting of silicon, nitrogen, phosphorous, and sulfur;

(2) 0.1 to 10 weight % of a photoinitiator;

(3) 5 to 50 weight % of a photopolymerizable reactive monomer; and (4) 30 to 75 weight % of water.

DETAILED DESCRIPTION OF THE INVENTION

According to the present invention, the water soluble polymer is prepared by the following steps. First, a water insoluble carboxyl group-containing polymer is reacted with an alkaline reagent so that a portion of the carboxyl groups are reacted in an amount sufficient to make the polymer water soluble. Then, the obtained polymer is reacted with an unsaturated bonds-containing epoxide and/or heteroatoms-containing epoxide to form ester groups via a ring-opening reaction of epoxides. In this manner, side chains containing unsaturated bonds and/or side chains containing heteroatoms can thus be introduced into the polymer. Thus, the water soluble polymer of the present invention is obtained. By means of the ring-opening reaction of epoxides, 1 to 100 mole percent of the remaining carboxyl groups of the polymer are reacted. Therefore, the final water soluble polymer may or may not have carboxyl groups.

In the situation that unsaturated side chains are introduced into the polymer, when the water soluble polymer of the present invention is exposed to light to undergo photocuring, the high ratio of unsaturated bonds can increase the photosensitivity of the polymer. Moreover, the introduction of side chains can also increase the flexibility of the polymer. In addition, in the situation that heteroatom side chains are introduced into the polymer, it may improve the adhesion between the polymer and the copper surface.

According to the present invention, the water insoluble carboxyl group-containing polymer can be a homopolymer or a copolymer of acrylic acids, acrylates, methacrylic acids, methacrylates, anhydrides or mixtures thereof. For example, it can be a copolymer of monomer A and monomer B. The monomer A can be acrylic acids, acrylates, methacrylic acids, methacrylates, anhydrides and mixtures thereof, and the monomer B is a styrene. The anhydrides suitable for use in the present invention include maleic anhydride, methyl maleic anhydride, endo-5-norbornene-2,3-dicarboxylic anhydride, and cis-1,2,3,6-tetrahydrophthalic anhydride.

In the present invention, the purpose of the alkaline reagent is to partially neutralize the carboxyl groups in the water insoluble polymer so as to make the polymer water soluble. The alkaline reagents suitable for use in the present invention include ammonium hydroxide ($NH_4OH$; ammonia water), sodium hydroxide, potassium hydroxide, 4-methylmorpholine, 2-amino-2-methyl-1-propanol, 2-dimethylamino-2-methyl-1-propanol, monoethanol amine, N,N-dimethylethanolamine, methyldiethanol amine, and morpholine.

According to the present invention, after the water insoluble carboxyl group-containing polymer is treated with the alkaline reagent, the epoxide used to react with the carboxyl groups can be the unsaturated bonds-containing epoxide only or the heteroatoms-containing epoxide only. Also, the unsaturated bonds-containing epoxide and the heteroatoms-containing epoxide can both be used.

The unsaturated bonds-containing epoxide suitable for use in the present invention can be glycidyl acrylate, glycidyl methacrylate, p-epoxy-styrene, p-glycidyl-styrene, or allyl glycidyl ether.

As to the heteroatoms-containing epoxide, the heteroatom refers to silicon, nitrogen, phosphorous, and sulfur. Representative examples include 3-glycidyloxypropyltrimethoxy silane or β-(3,4-epoxycyclohexyl)ethyl trimethoxysilane.

According to the present invention, the ring-opening reaction of the epoxide and the polymer treated with the alkaline reagent is preferably conducted at the presence of a phase transfer catalyst. Representative examples of the phase transfer catalyst suitable for use in the present invention include tetrabutylammonium bromide, tetrapropylammonium bromide, tetramethylammonium bromide, tetrabutylphosphonium bromide, tetraphenylphosphonium bromide, benzyl triethylammonium bromide, ethyl trioctyl phosphonium chloride, methyl trioctyl ammonium chloride, tetraphenylphosphonium chloride, methyl triphenylphosphonium chloride, tetrabutylammonium chloride, tetrabutylammonium iodide, and tetraphenylphosphonium iodide.

Preferably, the water soluble polymer of the present invention has a molecular weight of 5000 to 250000 and an acid value of 50 to 250.

The water soluble side chain-containing polymer of the present invention can be used as a photosensitive resin. A water soluble photoresist composition can be obtained by dissolving 10 to 50 weight % of the water soluble polymer of the present invention, 0.1 to 10 weight % of a photoinitiator, and 5 to 50 weight % of a photopolymerizable reactive monomer in 30 to 75 weight % of water. (The total weight of the photoresist composition is 100 weight %.) Preferably, the photoresist composition includes 15 to 35 weight % of the water soluble polymer of the present invention, 3 to 7 weight % of a photoinitiator, 15 to 35 weight % of a photopolymerizable reactive monomer, and 40 to 60 weight % of water.

The photoresist composition of the present invention is a negative type. That is, when the photoresist composition of the present invention is exposed to UV light, the exposed portion will undergo photocuring reaction, and the unexposed portion can be dissolved in a weak alkaline solution. The photoresist composition has high photosensitivity, good water dispersability, and storage stability. When the photoresist composition is coated on a printed circuit board, then dried and exposed to UV light, it is not tacky and will not stick to the mask. In addition, it has good adhesion to the copper on the printed circuit board.

The photoinitiator suitable for use in the present invention can be benzoin, benzoin alkyl ether, benzil, ketals, acetophenones, benzophenone, 4,4'-dimethyl-amino-benzophenone, thioxanthones, or morpholino-propanones.

The photopolymerizable reactive monomer suitable for use in the present invention can be a multifunctional acrylate or methacrylate. Representative examples include tetraethylene glycol diacrylate, tetraethylene glycol dimethacrylate, neopentylglycol diacrylate, neopentylglycol dimethyl acrylate, polyethylene glycol diacrylate, polyethylene glycol dimethylacrylate, ethoxylated bisphenol A glycol diacrylate, ethoxylated bisphenol A glycol dimethyl acrylate, trimethylolpropane trimethacrylate, trimethylolpropane triacrylate, pentaerythritol triacrylate, ethoxylated trimethylolpropane triacrylate, glyceryl propoxy triacrylate, pentaerythritol tetraacrylate, and dipentaerythritol pentaacrylate.

The following examples are intended to illustrate the process and the advantages of the present invention more fully without limiting its scope, since numerous modifications and variations will be apparent to those skilled in the art.

EXAMPLE 1

A small amount of ammonium hydroxide (ammonia water) was added dropwise in an acrylic acid resin having a molecular weight of 15500 and an acid value of 240 mg-KOH/g so as to make the pH value become 8–9. Then, the ammonia water-treated resin was dissolved in water at 70° C. to prepare a water soluble acrylic acid resin having a solid content of 30%. 100 g of the thus obtained resin was placed in a three-neck reaction vessel and heated to 90° C. 10.65 g of glycidyl methacrylate and 0.72 g of tetrabutylammonium bromide were further added and the reaction was conducted for 8 hours. The polymer obtained contained unsaturated side chains, and had a molecular weight of 16500 and an acid value of 100 mg-KOH/g.

2.4 g of the water soluble unsaturated bonds-containing acrylic resin, 0.4 g of Irgucure 907 (a photoinitiator purchased from Ciba), 0.1 g of 2-isopropylthioxanthone (a photoinitiator), 1.15 g of ethoxylated trimethylolpropane triacrylate, 0.05 g of A-DMA (a dye purchased from Hodogaya), and 5.6 g of water were mixed and stirred thoroughly. The mixture was ground with a three roller mill and then coated on a copper clad laminate. After dried at 80° C. for 10 minutes, a patterned mask was placed on the photoresist. It was found that the photoresist was not tacky and did not stick to the mask. After exposure to ultraviolet light (200 mJ/cm$^2$), the sample was developed with 1% Na$_2$CO$_3$ solution at 30° C. for 60 seconds to dissolve away the unexposed area. The exposed area was photopolymerized and had 100% adherence to copper (determined by the cross-cut test). The hardness was higher than 3H. The photoresist was developed to the fifth step in the Stouffer 21 step guide.

EXAMPLE 2

A small amount of ammonia water was added dropwise in an acrylic acid resin having a molecular weight of 8000 and an acid value of 215 mg-KOH/g so as to make the pH value become 8–9. Then, the ammonia water-treated resin was dissolved in water at 70° C. to prepare a water soluble acrylic acid resin having a solid content of 30%. 100 g of the thus obtained resin was placed in a three-neck reaction vessel and heated to 90° C. 13.6 g of glycidyl methacrylate and 0.93 g of tetrabutylammonium bromide were further added and the reaction was conducted for 8 hours. The polymer obtained contained unsaturated side chains, and had a molecular weight of 9000 and an acid value of 100 mg-KOH/g. 2.4 g of the water soluble unsaturated bonds-containing acrylic resin, 0.4 g of Irgucure 907 (a photoinitiator purchased from Ciba), 0.1 g of 2-isopropylthioxanthone (a photoinitiator), 1.15 g of ethoxylated trimethylolpropane triacrylate, 0.05 g of A-DMA (a dye purchased from Hodogaya), and 5.6 g of water were mixed and stirred thoroughly. The mixture was ground with a three roller mill and then coated on a copper clad laminate. After dried at 80° C. for 10 minutes, a patterned mask was placed on the photoresist. It was found that the photoresist was not tacky and did not stick to the mask. After exposure to ultraviolet light (200 mJ/cm$^2$), the sample was developed with 1% $Na_2CO_3$ solution at 30° C. for 60 seconds to dissolve away the unexposed area. The exposed area was photopolymerized and had 100% adherence to copper (determined by the cross-cut test). The hardness was higher than 3H. The photoresist was developed to the fifth step in the Stouffer 21 step guide.

EXAMPLE 3

A small amount of ammonia water was added dropwise in an acrylic acid resin having a molecular weight of 15500 and an acid value of 240 mg-KOH/g so as to make the ammoniated extent to about 80%. Then, the ammonia water-treated resin was dissolved in water at 70° C. to prepare a water soluble acrylic acid resin having a solid content of 20%. 100 g of the thus obtained resin was placed in a three-neck reaction vessel and heated to 90° C. 7.1 g of glycidyl methacrylate and 0.48 g of tetrabutylammonium bromide were further added and the reaction was conducted for 8 hours. The polymer obtained contained unsaturated side chains, and had a molecular weight of 16000 and an acid value of 140 mg-KOH/g.

2.4 g of the water soluble unsaturated bonds-containing acrylic resin, 0.4 g of Irgucure 907 (a photoinitiator purchased from Ciba), 0.1 g of 2-isopropylthioxanthone (a photoinitiator), 1.15 g of ethoxylated trimethylolpropane triacrylate, 0.05 g of A-DMA (a dye purchased from Hodogaya), and 5.6 g of water were mixed and stirred thoroughly. The mixture was ground with a three roller mill and then coated on a copper clad laminate. After dried at 80° C. for 10 minutes, a patterned mask was placed on the photoresist. It was found that the photoresist was not tacky and did not stick to the mask. After exposure to ultraviolet light (200 mJ/cm$^2$), the sample was developed with 1% $Na_2CO_3$ solution at 30° C. for 60 seconds to dissolve away the unexposed area. The exposed area was photopolymerized and had 100% adherence to copper (determined by the cross-cut test). The hardness was higher than 3H. The photoresist was developed to the eighth step in the Stouffer 21 step guide.

After the photoresist was stored for three months, the above-mentioned exposure evaluation was repeated. It was found that neither the resolution nor adhesion changed.

EXAMPLE 4

A small amount of ammonia water was added dropwise in an acrylic acid resin having a molecular weight of 15500 and an acid value of 240 mg-KOH/g so as to make the ammoniated extent to about 64%. Then, the ammonia water-treated resin was dissolved in water at 70° C. to prepare a water soluble acrylic acid resin having a solid content of 20%. 100 g of the thus obtained resin was placed in a three-neck reaction vessel and heated to 75° C. 5.68 g of glycidyl methacrylate, 2.36 g of 3-glycidyloxypropyltrimethoxy silane, and 0.483 g of tetrabutylammonium bromide were further added and the reaction was conducted for 4 hours. The polymer obtained contained silicon-containing side chains.

2.5 g of silicon-containing resin, 0.4 g of Irgucure 907 (a photoinitiator purchased from Ciba), 0.1 g of 2-isopropylthioxanthone (a photoinitiator), 0.6 g of ethoxylated trimethylolpropane triacrylate, and 8 g of water were mixed and stirred thoroughly. The mixture was ground with a three roller mill and then coated on a copper clad laminate. After dried at 80° C. for 10 minutes, a patterned mask was placed on the photoresist. It was found that the photoresist was not tacky and did not stick to the mask. After exposure to ultraviolet light (80 mJ/cm$^2$), the sample was developed with 1% $Na_2CO_3$ solution at room temperature for 60 seconds to dissolve away the unexposed area. The exposed area was photopolymerized and had 100% adherence to copper (determined by the cross-cut test). The hardness was higher than 3H. After immersing in an acidic etching solution, the photoresist still had 100% adherence to copper.

The advantages of the present invention can be summarized below:

(1) The polymer of the present invention is water soluble, and it can be mixed with water to form a water soluble photoresist composition. Also, the water soluble polymer of the present invention has good water dispersability and storage stability.

(2) By means of the reaction of the unsaturated bonds-containing epoxide with the carboxyl groups of the polymer, the unsaturated side chains can be introduced into the polymer, thus increasing the photosensitivity of the water soluble photoresist.

(3) By means of the reaction of the heteroatom-containing epoxide with the carboxyl groups of the polymer, the heteroatom side chains can be introduced into the polymer. This may help the adherence of the photoresist to the copper surface.

(4) When the photoresist composition of the present invention is coated on a printed circuit board, then dried and exposed to UV light, it is not tacky and will not stick to the mask. In addition, it has good adhesion to the copper on the printed circuit board.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A water soluble polymer comprising at least one heteroatom containing side chain, which polymer is prepared by the steps of:
    (a) reacting a carboxyl group-containing polymer with an alkaline reagent so that a portion of the carboxyl groups are reacted in an amount sufficient to make the polymer water soluble; and
    (b) reacting the polymer obtained from step (a) with a heteroatoms-containing epoxide so that 1 to 100 mole percent of the remaining carboxyl groups of the polymer are reacted with the epoxide to form ester groups via a ring-opening reaction of epoxides, wherein the heteroatom is selected from the group consisting of silicon, nitrogen, phosphorous, and sulfur.

2. The water soluble polymer as claimed in claim 1, wherein the carboxyl group-containing polymer is selected from the group consisting of homopolymers and copolymers of acrylic acids, acrylates, methacrylic acids, methacrylates, anhydrides and mixtures thereof.

3. The water soluble polymer as claimed in claim 2, wherein the carboxyl group-containing polymer is a copolymer of monomer A and monomer B, wherein the monomer A is selected from the group consisting of acrylic acids, acrylates, methacrylic acids, methacrylates, anhydrides and mixtures thereof, and the monomer B is a styrene.

4. The water soluble polymer as claimed in claim 3, wherein the anhydride is selected from the group consisting of maleic anhydride, methyl maleic anhydride, endo-5-norbornene-2,3-dicarboxylic anhydride, and cis-1,2,3,6-tetrahydrophthalic anhydride.

5. The water soluble polymer as claimed in claim 1, wherein the alkaline reagent is selected from the group consisting of ammonium hydroxide, sodium hydroxide, potassium hydroxide, 4-methylmorpholine, 2-amino-2-methyl-1-propanol, 2-di-methylamino-2-methyl-1-propanol, monoethanol amine, N,N-dimethylethanolamine, methyldiethanol amine, and morpholine.

6. The water soluble polymer as claimed in claim 5, wherein the alkaline reagent is ammonium hydroxide.

7. The water soluble polymer as claimed in claim 1, wherein the heteroatoms-containing epoxide is an epoxide containing silicon atom.

8. The water soluble polymer as claimed in claim 7, wherein the epoxide containing silicon is 3-glycidyloxypropyltrimethoxy silane or β-(3,4-epoxycyclohexyl)ethyl trimethoxysilane.

9. The water soluble polymer as claimed in claim 1, wherein step (b) is conducted at the presence of a phase transfer catalyst.

10. The water soluble polymer as claimed in claim 9, wherein the phase transfer catalyst is selected from the group consisting of tetrabutylammonium bromide, tetrapropylammonium bromide, tetramethylammonium bromide, tetrabutylphosphonium bromide, tetraphenylphosphonium bromide, benzyl triethylammonium bromide, ethyl trioctyl phosphonium chloride, methyl trioctyl ammonium chloride, tetraphenylphosphonium chloride, methyl triphenylphosphonium chloride, tetrabutylammonium chloride, tetrabutylammonium iodide, and tetraphenylphosphonium iodide.

11. The water soluble polymer as claimed in claim 1, which has a molecular weight of 5,000 to 250,000 and an acid value of 50 to 250.

12. A photoresist composition comprising the following components:
   (1) 10 to 50 weight % of a photosensitive resin which is a water soluble polymer comprising at least one heteroatom containing side chain, which polymer is prepared by the steps of:
      (a) reacting a carboxyl group-containing polymer with an alkaline reagent so that a portion of the carboxyl groups are reacted in an amount sufficient to make the polymer water soluble; and
      (b) reacting the polymer obtained from step (a) with a heteroatoms-containing epoxide so that 1 to 100 mole percent of the remaining carboxyl groups of the polymer are reacted with the epoxide to form ester groups via a ring-opening reaction of epoxides, wherein the heteroatom is selected from the group consisting of silicon, nitrogen, phosphorous, and sulfur;
   (2) 0.1 to 10 weight % of a photoinitiator;
   (3) 5 to 50 weight % of a photopolymerizable reactive monomer; and
   (4) 30 to 75 weight % of water.

13. The photoresist composition as claimed in claim 12, wherein the photoinitiator is selected from the group consising of benzoin, benzoin alkyl ether, benzil, ketals, acetophenones, benzophenone, 4,4'-dimethyl-amino-benzophenone, thioxanthones, and morpholino-propanones.

14. The photoresist composition as claimed in claim 12, wherein the photopolymerizable reactive monomer is a multifunctional acrylates or methacrylates.

15. The photoresist composition as claimed in claim 14, wherein the photopolymerizable reactive monomer is selected from the group consisting of tetraethylene glycol diacrylate, tetraethylene glycol dimethacrylate, neopentylglycol diacrylate, neopentylglycol dimethyl acrylate, polyethylene glycol diacrylate, polyethylene glycol dimethylacrylate, ethoxylated bisphenol A glycol diacrylate, ethoxylated bisphenol A glycol dimethyl acrylate, trimethylolpropane trimethacrylate, trimethylolpropane triacrylate, pentaerythritol triacrylate, ethoxylated trimethylolpropane triacrylate, glyceryl propoxy triacrylate, pentaerythritol tetraacrylate, and dipentaerythritol pentaacrylate.

* * * * *